United States Patent
Richard et al.

(10) Patent No.: US 7,422,918 B2
(45) Date of Patent: Sep. 9, 2008

(54) METHOD OF MAKING A SUPPORT FOR LIGHT EMITTING DIODES WHICH ARE INTERCONNECTED IN A THREE-DIMENSIONAL ENVIRONMENT

(75) Inventors: Stéphane Richard, Bobigny Cedex (FR); Jean-Marc Nicolai, Bobigny Cedex (FR)

(73) Assignee: Valeo Vision, Bobigny Cedex (FR)

( * ) Notice: Subject to any disclaimer, the term of this patent is extended or adjusted under 35 U.S.C. 154(b) by 180 days.

(21) Appl. No.: 11/286,161

(22) Filed: Nov. 22, 2005

(65) Prior Publication Data

US 2006/0148116 A1    Jul. 6, 2006

(30) Foreign Application Priority Data

Nov. 22, 2004   (FR) .................................. 04 12390

(51) Int. Cl.
*H01L 21/00* (2006.01)
(52) U.S. Cl. .............................. 438/48; 438/23; 438/42; 257/E33.001; 257/E27.12
(58) Field of Classification Search .................... 438/48
See application file for complete search history.

(56) References Cited

U.S. PATENT DOCUMENTS

| | | | |
|---|---|---|---|
| 6,087,680 A * | 7/2000 | Gramann et al. .............. | 257/91 |
| 6,936,855 B1 * | 8/2005 | Harrah ......................... | 257/88 |
| 2002/0068389 A1 | 6/2002 | Green ........................... | 438/149 |
| 2004/0149998 A1 * | 8/2004 | Henson et al. ................. | 257/98 |
| 2005/0265029 A1 * | 12/2005 | Epstein et al. ............... | 362/339 |

FOREIGN PATENT DOCUMENTS

| | | |
|---|---|---|
| DE | 3404644 A1 | 8/1985 |
| JP | 4-208588 | 7/1992 |

OTHER PUBLICATIONS

ESP@CENET Database Abstract of JP 4208588.
Patent Abstracts of Japan for JP 04208588.
English Abstract for DE 3404644.
Search Report corresponding to FR 0412390, Filed Nov. 22, 2004.

* cited by examiner

*Primary Examiner*—Walter Lindsay, Jr.
*Assistant Examiner*—Abdulfattah Mustapha
(74) *Attorney, Agent, or Firm*—Morgan & Finnegan, LLP

(57) ABSTRACT

The present invention relates to a method of making supports for light emitting diodes, wherein rigid substrates are used as supports for light emitting diodes, it being proposed, in particular, to render the substrates more fragile in order to make certain zones of a lower layer of the said substrate more flexible so that the substrate is able to deform in the region of the zones thus made flexible, the deformation then taking place without causing the electrical conduction of a top layer, on which the diodes are disposed, to be broken. In one particular embodiment of the invention it is proposed to provide as many rigid substrate plates as there are support planes in the three-dimensional environment, and to connect these various substrate plates together by means of deformable conductive components disposed in accordance with surface mounted component technology.

8 Claims, 1 Drawing Sheet

METHOD OF MAKING A SUPPORT FOR LIGHT EMITTING DIODES WHICH ARE INTERCONNECTED IN A THREE-DIMENSIONAL ENVIRONMENT

TECHNICAL FIELD OF THE INVENTION

The present invention relates to methods of making a support for light emitting diodes which are interconnected in a three-dimensional environment. Essentially, an object of the invention is to propose a solution in which a plurality of light emitting diodes (also called leds) are positioned on a support surface which lies in more than one plane in space, while at the same time ensuring their power supply, by proposing a method of making a support for the said diodes which can readily be made industrially. In addition, the object of the invention is achieved with a reduction in the cost of making the assemblies as compared with the current state of the art, to the extent that they perform the same function in a headlight apparatus.

The field of the invention is in general terms that of lighting and signaling in motor vehicles. In this field, various different types of apparatus are known, among which the essential ones are:

position lights, of low power and short range;
passing or dipped beam lights, of higher power and with a range of around 70 meters along the road;
long range cruising lights, and complementary lights of a long range type, which provide a visible zone along the road in the region of 200 meters;
improved headlights of the kind called dual mode lights, which combine the functions of passing lights and cruising lights by incorporating a removable mask;
fog lights;
signaling or indicating lights; and
lighting apparatuses within the cabin or other compartments of the vehicle, such as the glove box or the trunk, and so on.

For all of these lighting and indicating apparatuses, light sources are traditionally used which consist of halogen lamps or discharge lamps. However, for some years, motor equipment manufacturers have proposed the use of light emitting diodes, in particular for indicating lights, for example stop lights or flashing lights, or again for the fog lights. Light emitting diodes have a certain number of advantages, namely the following:

first of all, it has been known for a long time that diodes do not radiate light in all directions, but they direct it into a half space which is opposed to a substrate that supports the P-N function of the diode concerned; thus, by making use of more directional radiation than halogen or discharge lamps in the current state of the art, the quantity of energy lost is smaller than with discharge or halogen lamps;
next, improvements have recently been made to these diodes in terms of intensity of light emitted; they can sometimes emit a light flux of around 100 lumens. In addition, manufactured diodes have for a long time given red light, though sometimes also white light, which increases their possible range of use. The amount of heat which they give off is quite small, and a certain number of restrictions, connected with the dissipation of heat in headlight apparatus in the state of the art, disappear; and
finally, diodes use less energy, even with an equal amount of light emitted, than discharge lamps or halogen lamps; they are smaller in size and their particular form offers new possibilities in regard to their manufacture and how they are arranged on the complex surfaces on which they are to be put.

In general terms, light emitting diodes are disposed on a support of the substrate type, which, in a general definition, is a material which is adapted to receive the impression of an electronic circuit, and/or the various components which constitute that circuit. Various substrates are frequently used in the automotive field to act as a support for light emitting diodes. For example, they may consist of the following:

FR4 substrates, which are substrates consisting of epoxy glass cloth; substrates of this kind are used in most double-faced and multi-layer printed circuits.
SMI substrates; in particular, a first type of SMI substrate is known which is shown in FIG. 1, this being a substrate for a printed circuit consisting of a FR4 substrate 100 which is laid flat on a flat metallic base, and overlaid with a conductive layer 102 of copper. It is also known in particular to provide a second type of SMI substrate which is shown in FIG. 2, and which is a substrate for a printed circuit consisting of an insulating substrate 200 of the CML6 type (made of polymer containing ceramic reinforced with a glass fiber filler), which is laid flat on a metallic base 201, for example of aluminum, and overlaid with a conductive layer 202 of copper.
Substrates of this kind, which enable only printed circuits of the simple face type to be made, are perfectly appropriate to energy dissipating applications, typically in headlight apparatus for motor vehicles.
The CEM1 substrate, which is a substrate consisting of a central layer of paper between two layers of glass cloth, much used because of its low manufacturing cost.

PRIOR ART TECHNOLOGY OF THE INVENTION

In response in particular to aesthetic demands made by motor manufacturers, there are strong pressures for the increasingly common juxtaposition of a plurality of light emitting diodes within a common headlight apparatus, this juxtaposition often having to be made in three dimensions: in any one headlight apparatus, several different leds, which may be of different types, are arranged on different support planes. The solutions that currently exist for these juxtapositions consist, in the case of leds, essentially of the use of rigid standard electronic substrates of the kinds described earlier herein (CEM1, FR4), or heat dissipating substrates such as SMI or the like, or sometimes flexible electronic substrates of the kind called flex boards, which are for example made of PEN (ethylene polynaphthalate) or polyester or other materials, for receiving and holding the various leds and to provide their connections.

In the current state of the art, there are essentially three known solutions are known for making substrates intended to be put on a three-dimensional support surface.

The first of these solutions consists in the use of a flexible substrate which enables the conductive electrical tracks to be engraved on it, together with locations for soldering of the leds and electronic components that accompany them. Such a substrate typically has a thickness of 100 micrometers, and can easily be bent in order to follow the curvature of the support surface that is to carry it. A substrate of this kind also enables components of the SMC (surface mounted component) type to be brazed in position. However, a solution of this kind presents a large cost problem, especially where the distance between two levels supporting the leds are large, because in that case a large amount of excessively expensive material is then unused to the extent that it is not carrying any diodes.

A second solution consists in making use of a standard rigid substrate such as FR4 or CEM1, and in this case one plate of substrate material is arranged in each support plane that is to be occupied, in order to follow the three-dimensional form of the support surface which is imposed by the headlight apparatus, the various substrate plates being connected together by means of conductive wires, in particular to provide the power supply for the leds. However, an arrangement of this kind is not optimal in the context of industrial mass production, because the conductive wires must be arranged and soldered manually.

A third solution consists in making use of self-stripping metallic inserts, which enable the led to be supported mechanically and supplied with power electrically. An insert of this kind is positioned on a support of plastics material, which means that the curve of the support must incorporate wires which provide the electrical connection between the various leds. However, an arrangement of this kind is only suitable for insertable leds, and requires manual assembly.

All of the solutions envisaged in the current state of the art are therefore unsatisfactory whether for reasons of manufacturing cost, reasons of difficulty to adapt them for mass production of the manufacturing process, or again, reasons of limitation as to the types of led that can be used.

GENERAL DESCRIPTION OF THE INVENTION

The invention proposes a solution to the problems and drawbacks which have been discussed above. In general terms, the invention proposes to make use of rigid substrates to act as a support for the light emitting diodes, these substrates being less costly than the flexible substrates. In order to adapt them for a three-dimensional requirement in which they are to be arranged, the invention proposes, in particular, to make certain zones of a bottom layer of whatever substrate is used to be made fragile in order to make it more flexible, but with deformation then being able to take place without any break occurring in the electrical conduction of a top layer of the substrate, this top layer being the one on which the diodes are disposed. In this way, possibilities of bending in a rigid substrate are offered. In another embodiment of the invention, it is proposed to provide rigid substrate plates, with as many of these plates as there are support planes in the three-dimensional environment, and to join these various substrate plates together by means of deformable conductive components disposed in accordance with SMC (surface mounting components) technology.

Accordingly, the invention provides essentially a method of making a support for light emitting diodes, of the rigid substrate type comprising at least one bottom layer made in a first material and a top layer made of an electrically conductive second material, the said support being adapted to position a plurality of light emitting diodes on at least two distinct support planes within a headlight apparatus for a motor vehicle, characterized in that it comprises the plurality of steps which consist of:
  making sectors of the bottom layer made in the first material more flexible, so as to render them able to deform without causing rupture of the top layer;
  disposing the light emitting diodes on the top layer; and
  disposing the light emitting diode support on the various support planes, with at least one change of level between two successive support planes being ensured by the presence of at least one flexible sector of the bottom layer at the location of the change of level, in order to render possible the deformation of the light emitting diode support.

In a first example of an application of the method according to the invention, the step of making the sectors of the bottom layer more flexible consists in forming a groove at the place to be made more flexible in the sectors, in an aluminum layer constituting the bottom layer of the substrate, the said substrate being of the SMI type.

In a second embodiment of an application of the method of the invention, the step of making sectors of the bottom layer more flexible consists in forming a groove at the place to be made more flexible in the sectors, in a glass fiber layer which constitutes the bottom layer of the substrate, the said substrate being of the FR4 type.

In a third example of an embodiment of the invention, the step of making sectors of the bottom layer more flexible consists in omitting an aluminum layer constituting the bottom layer of the substrate, at the place to be made more flexible in the sectors, the said substrate being of the SMI type.

In a modified version of the third example of an application of the invention, the step of making sectors of the bottom layer more flexible consists in omitting, at the place to be made more flexible in the sectors, in addition to the aluminum layer that constitutes the bottom layer of the substrate, an intermediate layer of electrically insulating material.

In a modified version of the third example of its application, the method according to the invention includes, during the forming of the substrate of the SMI type, the preliminary additional step which consists in reducing the adhesion between two adjacent layers that constitute the said substrate at the place to be made more flexible in the sectors.

The present invention also provides a method of making a support for light emitting diodes, the said support comprising a plurality of rigid substrate plates, each substrate plate comprising at least one bottom layer formed of a first material and a top layer made of an electrically conductive second material, the said support being adapted to position a plurality of light emitting diodes on at least two support planes within an associated headlight apparatus for a motor vehicle, characterized in that it includes the plurality of steps which consist of:
  forming as many substrate plates, constituting the support, as there are separate support planes in the associated headlight apparatus;
  connecting at least two distinct substrate plates together by means of an electrically conductive specific component that permits deformation in three dimensions, the said specific component being welded by a refusion or hot rod brazing operation on the various substrate plates which are thereby joined together; and
  disposing the light emitting diode support in the various support planes, with a change of level between two successive support planes being effected by deformation of the specific component.

In a variant of all of the examples of applications given above, it can be arranged that the rigid substrate further includes, between the bottom and top layers, an intermediate layer of electrically insulating material.

The invention and its various applications will be understood more clearly on a reading of the following description and from examination of the accompanying drawings.

BRIEF DESCRIPTION OF THE DRAWINGS

These are presented by way of example only and are in no way limiting of the invention.

DESCRIPTION OF PREFERRED EMBODIMENTS OF THE INVENTION

The various elements appearing in the several Figures of the drawings will all keep the same reference sign unless stated otherwise.

Figure 1:
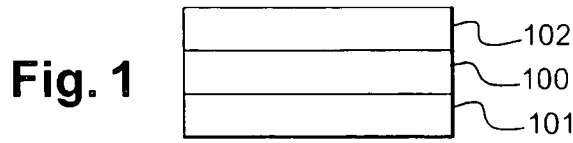
FIG. 1, which has already been described, shows a diagrammatic representation of a first example of an SMI substrate.
Figure 2:
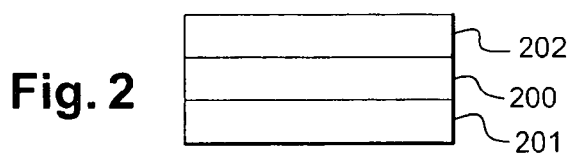
FIG. 2, which has also been described already, shows a diagrammatic representation of an SMI substrate.
Figure 3:
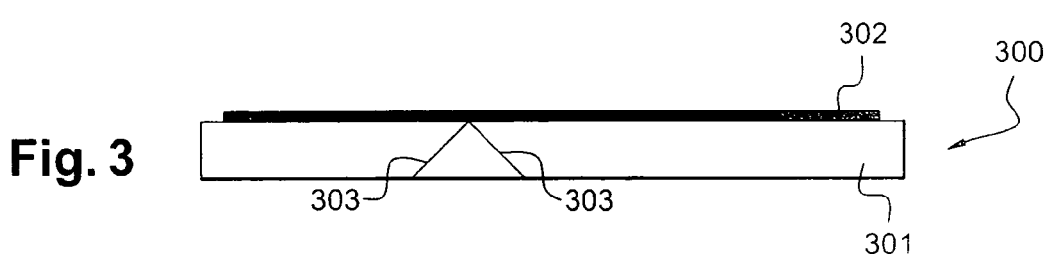
FIG. 3 illustrates a first example of the practical application of the method of the invention.
Figure 4:
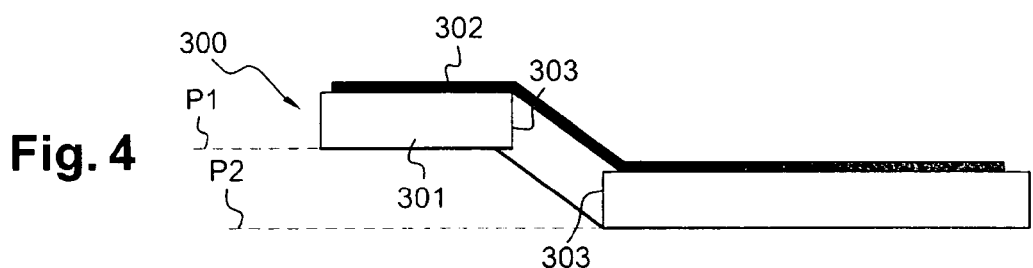
FIG. 4 illustrates a second example of a practical application of the method of the invention.

FIG. 3 and FIG. 4 show diagrammatically a support 300 for light emitting diodes which is used in two examples of embodiments of the method of the invention. The support 300 is a rigid substrate, which is either of the SMI type or of the FR4 type. In both cases it consists of at least one bottom layer 301 and a top layer 302, the said top layer being a relatively thick layer of copper which provides electrical continuity between the various light emitting diodes which will be disposed on it. Where the substrate 300 is of the SMI type, the bottom layer is of aluminum; where the substrate 300 is of the FR4 type, the bottom layer is a layer of glass fibre.

In the method of the invention it is proposed to make the substrate 300 more flexible by acting on the bottom layer 301 in such a way that the substrate 300 is able to bend, in order that, during mechanical assembly in the headlight apparatus, it will conform to distinct support planes within the headlight apparatus in which it is to be mounted; to this end, it is for example arranged that grooves or notches 303 are formed, in the bottom layer only, at the places in which the substrate has to have a change of level in order to pass from a first support plane to a second support plane. It is therefore possible to form, from a flat substrate structure as shown in FIG. 3, a cranked structure as shown in FIG. 4, in which the substrate 300 can be disposed in two distinct support planes P1 and P2, and without thereby causing any rupture in the conductive top layer 302.

In a modified version it is possible to arrange an intermediate layer of electrically insulating material between the bottom layer 301 and the top layer 302.

Figure 5:
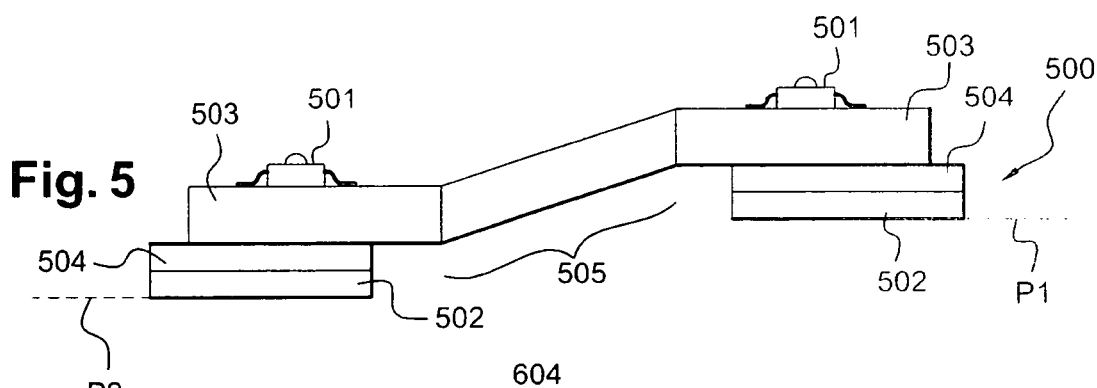
FIG. 5 illustrates a third example of a practical application of the method of the invention.

FIG. 5 shows diagrammatically a support 500 for light emitting diodes 501, which figures in a third example of an application of the method of the invention. In this example of an embodiment, the support 500 is a rigid substrate of the SMI type. Once again it consists of at least one bottom layer 502 and a top layer 503, the said top layer being a layer of copper which is thicker than in the preceding examples, having typically a thickness of 210 micrometers. Between the top layer 503 and the bottom layer 502, there is an intermediate layer 504 of thermally insulating material.

In accordance with the method of the invention, it is proposed to make the substrate 500 more flexible by omitting the bottom layer 502 in certain zones 505, called transition zones, in such a way that the substrate 500 can easily bend in order to fit the separate support planes within the headlight apparatus in which it is to be fitted, during mechanical assembly in the headlight apparatus; in one practical application, by way of example, the transition zones 505 are those above which the top layer is not going to support any light emitting diodes. The transition zones are thus preferential zones with respect to bending of the substrate 500, so that the latter can for example pass from the first support plane P1 to the second support plane P2.

In another version of the third embodiment of the method of the invention, the intermediate layer of electrically insulating material is also omitted in the transition zones 505. The omission of the bottom layer 502, and this optional omission of the intermediate layer 502 too, can, in one example of an application, be facilitated by a preliminary operation during the forming of the substrate 500, the preliminary operation being an operation in the course of which the adhesion between the various layers that constitute the substrate is deliberately reduced at the level of the transition zones.

The omission of the aluminum layer 502 in the transition zones also enables a connecting function to be obtained, between connecters of the card-edge type by which the headlight apparatus is connected to printed conductive tracks on the top layer 503; in this connecting function, at least one connecter is provided in which the main body of a printed circuit board, which in this case is the substrate 500 without the aluminum layer 502, is inserted, so as to provide direct contact with the contacts printed on the edge of the said circuit board. This is a particularly inexpensive way of providing the connecting function.

Figure 6:
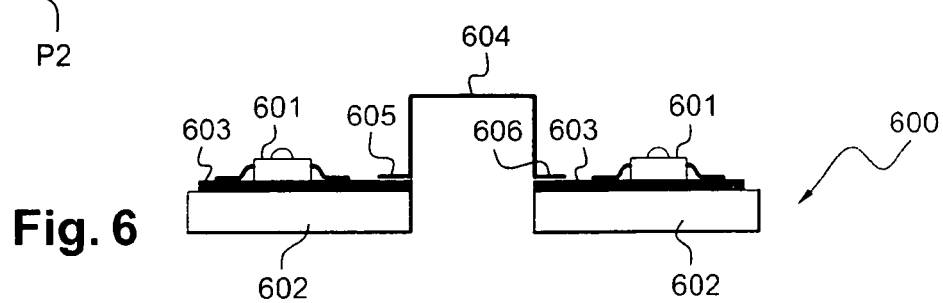
FIG. 6 illustrates a fourth example of a practical application of the method of the invention.

FIG. 6 shows diagrammatically a support 600 for light emitting diodes 601, in a first example of the application of the method of the invention. In this example the support 600 consists of rigid, standard plates of substrate material 602 (of the CEM1, SMI, FR4 type etc.), there being as many of these standard plates as there are distinct support planes for the diodes in the headlight apparatus which is to be equipped with the diodes.

In this example of an embodiment, the various substrate plates 602 are joined together by means of a specific electrically conductive component 604 which has a first end portion 605 and a second end portion 606; each of the end portions is in contact with an electrically conductive top layer 603 of one of the substrate plates 602, the layer 603 being typically a copper layer which also supports the light emitting diodes 601. The specific component 604 provides electrical connection between two separate substrate plates 602, and in addition it enables a first substrate plate to be displaced in three dimensions with respect to another substrate plate with which it is connected.

In a preferred embodiment, the specific component 604 is a component of the kind used in surface mounted component (or surfacing mounting component, or SMC) technology. This technology consists in welding components on a substrate at its surface, rather then inserting their connecting tags through it. The operation of welding the specific component 604 is carried out in the course of a refusion brazing operation, in which brazing material is deposited at the appropriate places in the top layer 603.

It is also possible to put an intermediate layer of electrically insulating material between the top layer 603 and the substrate plate 602.

Among the light emitting diodes which may be mounted on the supports which are made by the method of the invention, there may for example be mentioned those which are known by persons familiar with this technical field under the common commercial names of SMARTLED, POWER TOPLED, ADVANCE POWER TOPLED, DRAGON LED, PIRANHA, LUXEON (Trade Marks, Protection Applied For), etc.

The invention claimed is:

1. A method of making a support for light emitting diodes, the support comprising a rigid substrate comprising at least one bottom layer comprising a first material and a top layer comprising an electrically conductive second material, the support being adapted to position a plurality of light emitting diodes on at least two distinct support planes within a headlight apparatus for a motor vehicle, wherein the method comprises the steps of:
   (a) making sectors of the bottom layer more flexible, so as to render them able to deform without causing rupture of the top layer;
   (b) disposing the light emitting diodes on the top layer; and
   (c) disposing the light emitting diode support on the various support planes, with at least one change of level between two successive support planes being ensured by the presence of at least one flexible sector of the bottom layer at the location of the change of level, in order to render possible the deformation of the light emitting diode support.

2. A method according to claim 1, wherein the rigid substrate is of the SMI type and the bottom layer of the rigid substrate comprises aluminum and wherein the step of making sectors of the bottom layer more flexible comprises forming a groove at the place to be made more flexible in the sectors.

3. A method according to claim 1, wherein the rigid substrate is of the FR4 type and the bottom layer of the rigid substrate comprises a glass fiber layer and wherein the step of making sectors of the bottom layer more flexible comprises forming a groove at the place to be made more flexible in the sectors.

4. A method according to claim 1, wherein the rigid substrate is of the SMI type and wherein the step of making sectors of the bottom layer more flexible comprises omitting an aluminum layer in the bottom layer of the substrate at the places to be made more flexible in the sectors.

5. A method according to claim 4, wherein the step of making sectors of the bottom layer more flexible further comprises omitting, at the place to be made more flexible in the sectors, an intermediate layer of electrically insulating material.

6. A method according to claim 4, further comprising, during the forming of the substrate of the SMI type, the step of reducing the adhesion between two adjacent layers that comprise the substrate at the place to be made more flexible in the sectors.

7. A method of making a support for light emitting diodes, the support comprising a plurality of rigid substrate plates, each substrate plate comprising at least one bottom layer formed of a first material and a top layer formed of an electrically conductive second material, the support being adapted to position a plurality of light emitting diodes on at least two support planes within an associated headlight apparatus for a motor vehicle, wherein the method comprises the steps of:
   (a) forming as many substrate plates, constituting the support, as there are separate support planes in the associated headlight apparatus;
   (b) connecting at least two distinct substrate plates together by an electrically conductive specific component that permits deformation in three dimensions, the specific component being welded by a refusion or hot rod brazing operation on the various substrate plates which are thereby joined together; and
   (c) disposing the light emitting diode support in the various support planes, with a change of level between two successive support planes being effected by deformation of the specific component.

8. A method of making a support for light emitting diodes according to claim 1, wherein the rigid substrate further comprises an intermediate layer of electrically insulating material disposed between the bottom and top layers.

* * * * *